United States Patent [19]

Hickling et al.

[11] Patent Number: 4,471,238
[45] Date of Patent: Sep. 11, 1984

[54] CURRENT-DRIVEN LOGIC CIRCUITS

[75] Inventors: Ronald M. Hickling, Santa Monica; Jay E. Landenberger, El Segundo, both of Calif.

[73] Assignee: Hughes Aircraft Company, El Segundo, Calif.

[21] Appl. No.: 383,407

[22] Filed: Jun. 1, 1982

[51] Int. Cl.³ .................... H03K 19/094; H03K 19/20
[52] U.S. Cl. .................................... 307/450; 307/270; 307/571
[58] Field of Search ............... 307/445, 448, 450, 571, 307/572, 550, 270, 304, 315; 357/22 G

[56] References Cited

U.S. PATENT DOCUMENTS

| | | | |
|---|---|---|---|
| 4,093,925 | 6/1978 | Yokoyama | 307/270 |
| 4,300,064 | 11/1981 | Eden | 307/450 |
| 4,394,589 | 7/1983 | Pham et al. | 307/450 |

FOREIGN PATENT DOCUMENTS 26471 2/1982 Japan ................ 357/22 G

OTHER PUBLICATIONS

Long et al., "High Speed GaAs Integrated Circuits", *Proceedings of the IEEE*, vol. 70, No. 1, Jan. 1982, pp. 35–45.
Suyama et al., "Design and Performance of GaAs Normally-Off MESFET Integrated Circuits", *IEEE Transactions on Electron Devices*, vol. ED 27, No. 6, Jun. 1980, pp. 1092–1097.

Primary Examiner—Larry N. Anagnos
Assistant Examiner—David R. Hudspeth
Attorney, Agent, or Firm—C. L. Anderson; W. J. Benman, Jr.; A. W. Karambelas

[57] ABSTRACT

An enhancement-mode field effect transistor (ENFET) logic circuit providing greater fan-out capability. The logic circuit employs a conventional common-source inverter section, but additionally incorporates a current-driving section which drives the common-source inverter section. A current-driven inverter logic circuit is realized by employing a second ENFET transistor to drive the gate of the common-source inverter section. A current-driven NOR gate is realized by employing two ENFET transistors in parallel which drive the common-source inverter section. Also a current-driven NAND gate is realized by utilizing a single transistor having two gate inputs to drive the common-source inverter section. The use of sweep-out circuitry allows for control of the operational speed of the device. The logic circuit designs have high fan-out capability compared to the common-source inverter circuit alone.

4 Claims, 3 Drawing Figures

CURRENT-DRIVEN LOGIC CIRCUITS

BACKGROUND OF THE INVENTION

The present invention relates generally to enhancement-mode field effect transistor (ENFET) logic circuits, and more particularly to ENFET logic circuits which are current driven to provide for greater fan-out capability.

Heretofore, enhancement-mode field effect transistor logic circuits have been based on a common-source inverter configuration. This particular inverter design has poor fan-out capability due to the high level of gate current which exists in the device when a logic high input signal is applied thereto. Fan-out refers to the number of circuits which may be connected to the output of one particular logic circuit and which may be driven thereby. The design of high-level logic circuits requires that the devices used therein have relatively high fan-out ratios. In certain circumstances it is impossible for a single ENFET inverter circuit to drive even two additional circuits.

Conventional ENFET circuits are described in publications entitled "High Speed GaAs Integrated Circuits," by Steven I. Long et al, Proceedings of the IEEE, Vol. 70, No. 1, January 1982, and "Design and Performance of GaAs Normally-Off MESFET Integrated Circuits," by Katsuhiko Suyama et al, IEEE Transactions on Electron Devices, Vol. ED 27, No. 6, June 1980.

Accordingly, it would be an improvement in the art to have an enhancement-mode ENFET logic circuit design which allows for greater fan-out capability.

SUMMARY OF THE INVENTION

In order to overcome the fan-out problems existing in prior art enhancement-mode logic circuit designs, the present invention provides for a logic circuit design which allows operation of the device in a current-driven mode. The logic circuit employs the conventional common-source inverter configuration, but additionally includes circuitry which drives the inverter in a current mode. Operation in this mode lowers the input current requirements of the logic circuit and hence raises the fan-out capability thereof.

In particular, an enhancement-mode field effect transistor logic circuit is provided which has a common source inverter section comprising a first ENFET transistor having a gate input and an output taken at its drain electrode. The improvement provided by the present invention comprises a current-driving section having at least one additional ENFET transistor with a second gate input for receiving input signals and an output taken at its source electrode coupled to the gate input of the common source inverter section. The additional transistor provides driving current to the inverter section and requires a lower input current to achieve the same drain current in the first transistor. The lower input current requirements allow for a greater fan-out capability of the logic circuit.

Circuits other than the current-driven inverter circuit may be realized by the present invention by simply modifying the current-driving section used to provide driving current to the common-source inverter section. For example, a current-driven NOR gate configuration is provided by coupling a second transistor in parallel with the first transistor of the current-driving section, with each transistor having its gate input adapted to receive input signals. The output of this transistor pair is utilized to drive the gate of the common-source inverter section. Also a current-driven NAND gate may be provided by employing a single transistor in the current-driving section having two gate inputs to drive the common-source inverter section.

BRIEF DESCRIPTION OF THE DRAWINGS

The present invention may be more readily understood with reference to the following detailed description taken in conjuction with the accompanying drawings, wherein like reference numerals designate like structural elements, and in which.

DETAILED DESCRIPTION

In an enhancement-mode field effect transistor, the gate current thereof uniquely defines the gate-source voltage. Consequently, the drain current may be characterized as a function of gate current. The current gain of an ENFET device, defines as the drain current divided by the gate current ($I_D/I_G$), is very low for high levels of gate current and extremely high for low levels of gate current. The conventional common-source inverter configuration operates in the low current gain region when presented with a logic high input. Therefore improved performance may be had when the inverter operates at low levels of gate current.

Figure 1:
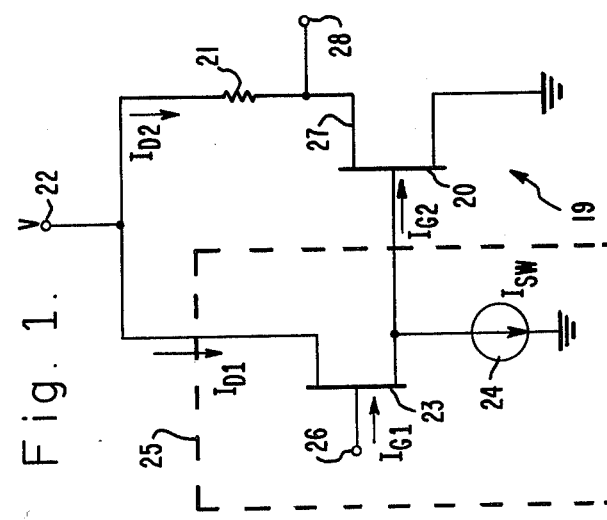
FIG. 1 illustrates a current-driven inverter circuit in accordance with the principles of the present invention.

Referring to FIG. 1 there is shown an enhancement-mode field effect transistor (ENFET) logic circuit in accordance with the principles of the present invention. The logic circuit comprises a conventional common-source inverter section 19 comprising a first ENFET transistor 20 which is coupled between a voltage source 22 and ground. A load resistor 21 is connected between the drain electrode and the voltage source 22. A signal output 28 of the first transistor 20 is made available at its drain electrode. The source electrode of the first transistor 20 is connected to ground.

In order that the logic circuit of FIG. 1 operate at low levels of input current, the present invention additionally incorporates a current-driving section 25 (shown generally as a dashed box) comprising a second ENFET transistor 23 which is coupled between the voltage source 22 and ground. The source electrode of the second transistor 23 is coupled to the gate input 27 of the first transistor 20 and additionally coupled through sweep-out circuitry 24 to ground. In the logic circuits illustrated in FIGS. 1, 2 and 3, the sweep-out circuitry 24 is a current source, which provides a constant current independent of the input voltage of the common source inverter section. Input signals to the logic circuit are applied to the gate input 26 of the second transistor 23.

The operation of the logic circuit of FIG. 1 may be described with reference to the various currents flowing throughout the device. The common-source inverter section 19 operates in a low current gain region when the drain current in the first transistor 20 ($I_{D2}$) is high. Thus, the current gain of the first transistor 20, defined as $I_{D2}/I_{G2}$, is very low. Consequently, the common-source inverter section 19 draws a significant amount of gate current ($I_{G2}$). In the second transistor 23, however, a source current exists given by its gate current ($I_{G2}$) and the sweep-out current ($I_{SW}$), defined at $I_{G2}+I_{SW}$, which is smaller than the drain current ($I_{D2}$) of the first transistor 20. This source current is small enough so that the second transistor 23 operates in its high current gain region, with this gain being defined as $I_{D1}/I_{G1}$. Therefore the present invention achieves control of a large current swing in the drain of the first transistor with a significantly reduced current swing at the input to the second transistor 23. The overall current gain of the logic cicuit of FIG. 1 ($I_{D2}/I_{G1}$) is defined as the product of the current gains of the two transistors 20, 23, and is given by $I_{D1}/I_{G1} \times I_{D2}/I_{G2}$.

The first transistor 20 operates in its low current gain region. However, since transistor 23 operates in its high current gain region, the total current gain of the entire logic circuit, defined as the ratio $I_{D2}/I_{G1}$, is very high, since it is the product of the two individual current gains of the first and second transistors 20, 23. Therefore, for the same logic swing applied to the gate input 26 of the second transistor 23, the required input current is much less than that of the common-source inverter section 19 alone. Accordingly, greater fan-out capability is provided by the current-driven logic circuit of FIG. 1.

The sweep-out current ($I_{SW}$), generated by the sweep-out circuitry 24, is provided so that the logic circuit may operate at high speed. The sweep-out current ($I_{SW}$) is required in order to deplete the second transistor 23 when it is turned off. The sweep-out current may be adjusted accordingly for any desired operational speed. Raising the sweep-out current increases the maximum frequency of operation and lowers the fanout capability. Conversely, lowering the sweep-out current raises the fan-out capability and lowers the maximum operating frequency.

Figure 2:
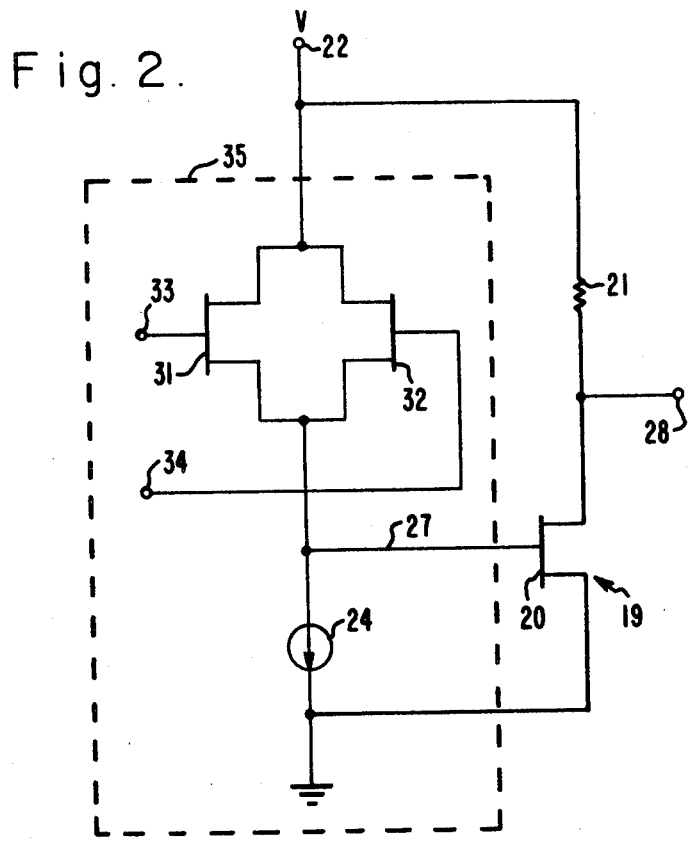
FIG. 2 illustrates a current-driven NOR gate logic circuit in accordance with the principles of the present invention.

Numerous other logic circuits may be designed using the current-driving technique contemplated by the present invention. For example, FIG. 2 illustrates a current-driven NOR gate logic circuit in accordance with the principles of the present invention. This circuit is similar to the inverter circuit of FIG. 1, but the current-driving section 35 comprises two transistors 31, 32 arranged in parallel with each other. Each of the two transistors 31, 32 have separate gate inputs 33, 34, respectively, adapted to receive input signals. The drain electrodes of both transistors 31, 32 are connected to the voltage source 22 while the source electrodes thereof are connected to the gate 27 of transistor 20 and to the sweep-out circuitry 24.

Figure 3:
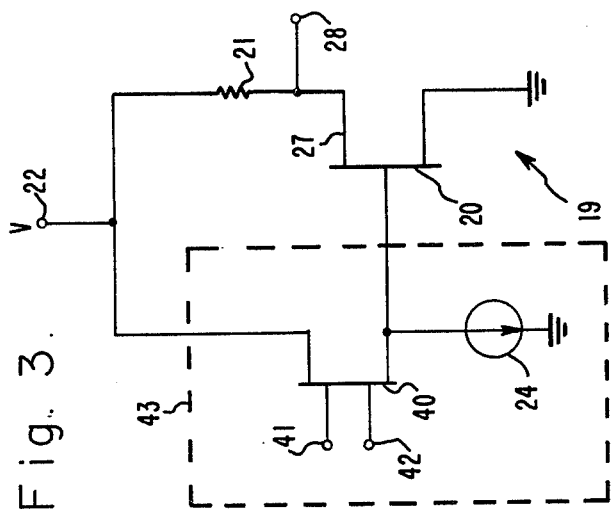
FIG. 3 illustrates a current-driven NAND gate logic circuit in accordance with the principles of the present invention.

FIG. 3 illustrates a current-driven NAND gate logic circuit in accordance with the principles of the present invention. In this logic circuit, the current-driving circuit 43 comprises a single transistor 40 having two gate inputs 41, 42 adapted to receive separate input signals. The drain electrode is coupled to the voltage source 22 while the source electrode is coupled to both the gate 27 of the first transistor 20 and to the sweep-out circuitry 24.

The logic circuits of FIGS. 2 and 3 operate as conventional NOR and NAND gate circuits, respectively. However, the incorporation of the current-driving sections 35, 43 in each respective circuit allows these devices to operate with greater fan-out capability. Therefore, these circuits, as well as the inverter circuit of FIG. 1, provide logic circuits which have the benefits of high speed and high fan-out ratios without additional complexity. These circuits allow for the design of complex higher-level logic circuits requiring large fan-out ratios, heretofore unobtainable with conventional logic circuit designs.

Thus, new and improved logic circuit designs have been described which incorporate enhancement-mode field effect transistors. The logic circuits operate in a current-driven mode. The logic circuit designs provide for greater fan-out capability while additionally allowing high-speed operation.

It is to be understood that the above-described embodiments are merely illustrative of some of the many specific embodiments which represent applications of the principles of the present invention. Clearly, numerous and varied other arrangements may be readily devised by those skilled in the art without departing from the spirit and scope of the invention.

What is claimed is:

1. A logic circuit comprising:
    a common source inverter section including a first enhancement mode field effect transistor (ENFET) having gate, source and drain electrodes, said drain electrode being connected to a signal output terminal, said signal output terminal being coupled to a first power source terminal through a load means, said source electrode being connected to a second power source terminal;
    a current driving section including a second ENFET having gate, source and drain electrodes, said second ENFET gate electrode being coupled to a first signal input terminal, said second ENFET drain electrode being connected to said frist power source terminal, said second ENFET source electrode being connected to said first ENFET gate electrode, and a current source being coupled between said first ENFET gate electrode and said second power source terminal for effecting a constant current therebetween.

2. The logic circuit of claim 1 further characterized in that it is a current-driven inverter circuit.

3. The logic circuit of claim 1 further comprising a third ENFET having gate, source and drain electrodes, said third ENFET gate electrode being coupled to a second signal input terminal, said third ENFET drain electrode being connected to said first power source terminal, and said third ENFET source electrode being connected to said first ENFET gate electrode so that said logic circuit is a current-driven NOR gate circuit.

4. The logic circuit of claim 1 further characterized in that said second ENFET has a second gate electrode coupled to a second signal input terminal so that said logic circuit is a current-driven NAND gate.

* * * * *